United States Patent [19]

Riha

[11] Patent Number: 4,520,330
[45] Date of Patent: May 28, 1985

[54] ELECTRONIC COMPONENT FUNCTIONING WITH REFLECTED ACOUSTIC WAVES

[75] Inventor: Gerd Riha, Munich, Fed. Rep. of Germany

[73] Assignee: Siemens Aktiengesellschaft, Berlin & Munich, Fed. Rep. of Germany

[21] Appl. No.: 520,418

[22] Filed: Aug. 4, 1983

[30] Foreign Application Priority Data

Aug. 12, 1982 [DE] Fed. Rep. of Germany ....... 3230038

[51] Int. Cl.³ .................... H03H 9/64; H03H 9/145
[52] U.S. Cl. ............................ 333/195; 310/313 D; 333/153; 333/196

[58] Field of Search .................. 333/150–155, 333/193–196, 141–149; 310/313 R, 313 A, 313 B, 313 C, 313 D, 365, 367

[56] References Cited

U.S. PATENT DOCUMENTS 4,267,534  5/1981  Tanski ................. 333/153
4,336,514  6/1982  Paige .................. 333/195

Primary Examiner—Marvin L. Nussbaum
Attorney, Agent, or Firm—Hill, Van Santen, Steadman & Simpson

[57] ABSTRACT

A component has a reflector structure with fingers which are weighted by division into sub-fingers in a longitudinal direction. These sub-fingers are offset relative to one another in a wave propagation direction by a dimension of the weighting.

6 Claims, 4 Drawing Figures

ELECTRONIC COMPONENT FUNCTIONING WITH REFLECTED ACOUSTIC WAVES

BACKGROUND OF THE INVENTION

The present invention relates to an electronic component functioning with reflected acoustic waves on a substrate, said substrate having a reflector structure having finger weighting associated therewith.

A surface wave filter designed as a dispersive delay line and an improvement relating to such a filter are disclosed in U.S. Ser. Nos. 377,466, now U.S. Pat. No. 4,427,954, and 472,980, now U.S. Pat. No. 4,484,160; and German application No. P 32 09 962.2, the U.S. Ser. No. 472,980 being incorporated herein by reference. Particularly in the case of the above cited second and third applications, an electronic component functioning with acoustic waves is provided whereby the finger weighting employed to achieve a specific, prescribed transfer function is achieved such that a spacing of finger groups from one another and of individual strip-like fingers from one another is varied relative to a position of the fingers which would correspond to such a component without finger weighting. In the first cited patent application this finger weighting is realized by means of finger length weighting fundamentally known per se. The non-equidistant spacings of fingers or finger groups from one another in this component serve to achieve a prescribed dispersion of said component.

The invention of the German application No. P 32 09 962.2 offers the advantage (apart from a dispersion realized in this component) of providing the finger weighting necessary for the prescribed amplitude function of the transfer characteristic such that the active portions of the individual fingers of the respectively employed digital structure (structures) extends over the entire width of the working area of the electronic component, i.e. over the entire width of the structure (structures) at right angles relative to the primary propagation direction of the acoustic wave. Despite the presence of a finger weighting, disruptive side effects which are connected with finger length weighted structures or with finger dot weighted structures should be avoided.

In the extreme case, given an electronic component according to German application No. P 32 09 962.2, a shift of respectively adjacent fingers relative to one another can be provided in order to realize the necessary finger weighting (related to a non-weighted structure), i.e. a respective finger group to be subjected to finger weighting consists of only two fingers. Thus, maximum band width is achieved for a structure or for a component according to this earlier invention.

SUMMARY OF THE INVENTION

It is an object of the present invention to specify a finger weighting for an electronic component functioning with reflected acoustic waves which (just like the finger weighting according to the earlier invention of the application No. P 32 09 962) is free of disruptive side effects, but which nonetheless allows the greatest possible (in comparison to a component without finger weighting) or even greater band width in comparison to the earlier invention.

Given an electronic component as previously described, according to the invention the fingers of the reflector structure to be weighted are functionally divided at least once in their longitudinal direction so as to create sub-fingers. The sub-fingers are offset relative to one another in a primary wave propagation direction by a dimension corresponding to a prescribed weighting.

The present invention is based on the consideration that even greater band width of the respective digital structure or of the entire component can only be achieved in comparison to the earlier invention by following a relatively different solution. For this different solution, one can begin with a known electronic component functioning with acoustic waves and, for example, from a component of the earlier application U.S. Ser. No. 377,466 as well which exhibits varied finger spacings for the realization of a dispersion.

The present invention is based on the idea of providing a "finger displacement" which will already influence the individual fingers or the respective individual finger as a finger weighting. The underlying principle of this solution consists of dividing the respective individual finger to be subjected to a finger weighting in a corresponding structure of the electronic component at least once in the longitudinal direction of the finger and to position the at least two parts which have arisen parallel to the primary wave propagation direction in offset manner relative to one another. The primary wave propagation direction is the intended direction in which the acoustic wave proceeds in the electronic component. Given a component with 180° reflection, this is usually a single direction. Given a component with wave reflection differing from 180°, for example having 2°×90° wave reflection (with reflection fingers placed obliquely at an angle of 45°), one primary wave propagation direction then exists which is traversed in the forward direction and parallel thereto in the return direction and a further primary wave propagation direction exists which runs at right angles thereto. Given the latter design of the electronic component, the offset of the finger parts can be realized parallel to one primary wave propagation direction or to the other primary wave propagation direction, or partially to the one and partially to the other primary wave propagation direction. The longitudinal direction of said fingers mentioned in conjunction with the division of the individual fingers is the direction of the largest geometrical dimension of the individual fingers. Given a component with 180° reflection, this longitudinal direction of the finger is usually orthogonal relative to the primary wave propagation direction. Given a component with a bent path of the wave propagation of the acoustic wave, the longitudinal direction of the corresponding finger given, for example 90° reflection in the component, usually proceeds at an angle of 45° relative to the one and to the other primary wave propagation direction (homogeneous or isotropic conditions assumed).

DESCRIPTION OF THE PREFERRED EMBODIMENTS

Figure 1:
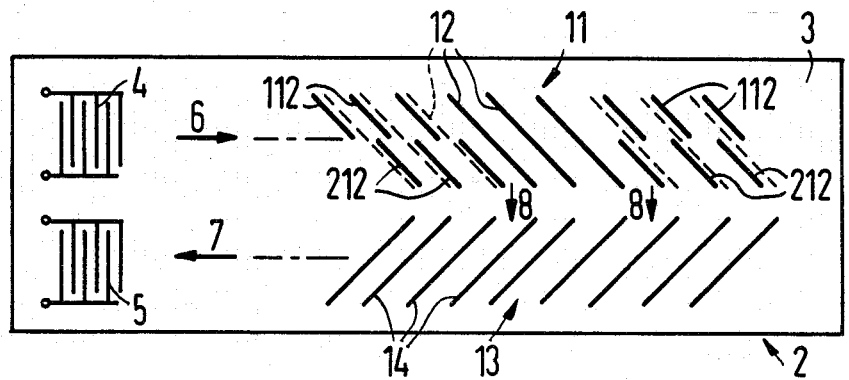
FIG. 1 is a plan view of a preferred embodiment of an electronic component according to the invention functioning with reflected acoustic waves.

FIG. 1 shows a fundamental embodiment of an electronic component functioning with reflected acoustic waves having wave reflection at angles differing from 180°. The illustrated structures or the existing electrode fingers are preferably metallization strips which are situated on the upper surface 3 of the substrate body 2 in FIG. 1. Two known inter-digital transducer structures are referenced 4 and 5. In the one structure, an acoustic surface wave is generated from the electric input signal in the piezo-electric material of the surface 3 of the substrate body 2. An electric signal can be regained from the received acoustic wave with the other of these transducers. The electric input signal and output signal differ from one another in accordance with the transfer function provided for this component.

Given the example of FIG. 1, the transducer 4 is assumed to be the input and the transducer 5 is assumed to be the output so that primary wave propagation directions as indicated by the arrows 6, 7, and 8 result. The acoustic wave thus proceeding in the direction of arrow 6 strikes a first reflection digital structure 11 which consists of a plurality of reflection fingers 12 placed obliquely in a manner known per se. After the reflection in the direction of the arrow 8 accomplished at these fingers, the acoustic wave strikes the second, illustrated reflection digital structure which consists of a plurality of reflector fingers 14 again placed obliquely. After reflection accomplished at this structure 13, the wave proceeds or the primary wave propagation direction proceeds parallel to the direction of arrow 7.

The respective length of a reflection digital structure 11, 13 is based in a known manner on the prescribed demands which are made of the corresponding electronic component.

In FIG. 1, the reflection digital structure 11 contains a finger weighting with which the prescribed transfer function of the component is met in view of the amplitude function. A required dispersion property given a component according to FIG. 1 can be realized by means of non-equidistant spacings of individual fingers or finger groups relative to one another. These spacings refer to a position of the individual fingers of a digital structure which has no dispersion (and no finger weighting by means of finger displacement according to the earlier invention). Given the example of FIG. 1, such a non-dispersive, non-weighted reflection digital structure is shown with the structure 13. However, it should be noted that the structure 13 given in the example of FIG. 1 could also be provided a dispersive and/or a weighted property by means of mutual cross-displacement.

In FIG. 1, those electrode fingers 12 which must exhibit a corresponding weighting are divided once in length so that two respective sub-fingers 112, 212 result. These two sub-fingers are displaced relative to one another by the dimension resulting from the required weighting, namely parallel to the primary wave propagation direction 6 in FIG. 1. As is standard for finger weighting, this finger weighting is distributed as a modulation over the entire reflection digital structure 11 (provided with finger weighting). A finger weighting of a zero location (which would correspond to an overlap "zero" given known overlap weighting) derives for a displacement of the sub-fingers 112 and 212 relative to one another by the dimension λ/2. An offset of the two finger parts 112 and 212 in the quantity "zero", i.e. as exists given the fingers 12 in the center of the structure 11, corresponds to a transfer maximum or a complete overlap. As a result of less pronounced interference, intermediate values of the offset of the finger parts 112, 212 relative to one another produce the corresponding intermediate values of a finger weighting between transfer maximum and minimum. Let it be pointed out here that the respective component parallel to the corresponding primary wave propagation direction (here the direction of arrow 6) is the respective governing factor for the offset. Given the sample embodiment of FIG. 1, this is the projection onto the direction of arrow 6 due to the oblique position of the fingers 12.

Figure 2:
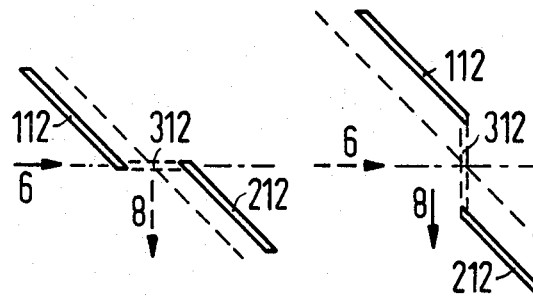
FIGS. 2, 3, and 4 illustrate three embodiments of a finger weighting offset for sub-fingers forming a portion of the structure illustrated in FIG. 1.
Figure 3:
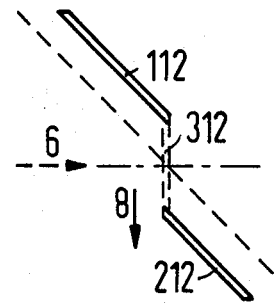
Figure 4:
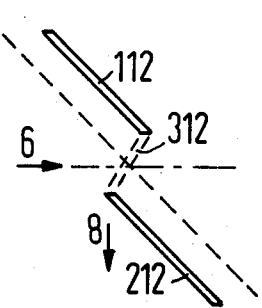

Shown next to one another for one finger (for example for a finger 12) of a component with obliquely directed reflection digital structure, FIGS. 2, 3 and 4 illustrate three possibilities of the finger weighting offset according to the invention. FIG. 2 (as in FIG. 1) shows the offset parallel to the direction of the arrow 6. FIG. 3 illustrates the offset (only) in the direction parallel to the direction of arrow 8. And FIG. 4 shows an offset partially parallel to the direction of arrow 6 (or 7) and partially parallel to the direction of the arrow 8. It is particularly the technique corresponding to FIG. 2 which is suitable for minimizing conceivable disruptions because no spacing therefor between the sub-fingers 112, 212 appears in the running direction of the wave. It should be pointed out concerning FIGS. 2 through 4 that they are significantly enlarged sections in comparison to the scale of FIG. 1.

As already indicated above, the other reflection digital structure 13 (instead of the reflection digital structure 12) can have the inventive finger weighting (described above relating to structure 11). The necessary finger weighting can also be divided between both reflection digital structures 11, 13. Correspondingly divided, it thus can be achieved that the required finger offset is smaller.

A single, respective finger can also be divided over its length into more than only two finger parts 112, 212. A multiple subdivision of a respective finger in the longitudinal direction allows greater sophistication of the corresponding structure to be achieved, while accepting a corresponding, additional technological expense.

The sub-fingers 112, 212 belonging to a finger 12 can be connected (shown at 312) to one another, as indicated with broken lines in FIGS. 2 through 4. Disruptions due to such a connection 312 are generally negligible because the respective spacings between the adjacent end of the respective sub-fingers 112, 212 or the lengths of the individal connections are smaller on the order of one or more magnitudes than the length of the finger 12 or sub-fingers 112, 212. Technological advantages for the manufacture of the structure can thus be achieved.

Although various minor changes and modifications might be proposed by those skilled in the art, it will be understood that I wish to include within the claims of the patent warranted hereon all such changes and modifications as reasonably come within my contribution to the art.

I claim as my invention:

1. An electronic component functioning with reflected acoustic waves on a substrate and which has a reflector structure, input means for transmitting a primary wave, and output means for receiving a reflected wave, and wherein the reflector structure has finger weighting by means of displacing a position of strip-like fingers to be weighted, wherein the improvement comprises: the strip-like fingers to be weighted are functionally divided at least once in their longitudinal direction so as to create sub-fingers; and the sub-fingers are offset relative to one another in a primary wave propagation direction by a dimension corresponding to a prescribed weighting.

2. A component according to claim 1 wherein the reflector structure provides a bent path for acoustic waves of a primary wave propagation, and said offset corresponding to the weighting is parallel to a primary wave propagation direction which exists before a wave reflection at a corresponding weighted finger of the reflector structure after the waves leave the input means.

3. A component according to claim 1 wherein the reflector structure provides a bent path for the acoustic waves of the primary wave propagation, and said offset corresponding to the weighting is parallel to a primary wave propagation direction which exists after a first wave reflection at a respective finger along the bent path.

4. An electronic component functioning with reflected acoustic waves on a substrate and which has a reflector structure, input means for transmitting a primary wave, and output means for receiving a reflected wave, and wherein the reflector structure has finger weighting by means of displacing a position of fingers to be weighted, wherein the improvement comprises: the fingers to be weighted are functionally divided at least once in their longitudinal direction so as to creat sub-fingers; the sub-fingers are offset relative to one another in a primary wave propagation direction by a dimension corresponding to a prescribed weighting; the reflector structure providing a bent path for the acoustic waves of the primary wave propagation; and said offset corresponding to the weighting is partially parallel to a primary wave propagation direction which exists before a wave reflection at a corresponding weighted finger of the reflector structure after the waves leave the input means, and is partially parallel to a primary wave propagation direction which exists after a first wave reflection at a respective finger along the bent path.

5. An electronic component functioning with reflected acoustic waves on a substrate and which has a reflector structure, input means for transmitting a primary wave, and output means for receiving a reflected wave, and wherein the reflector structure has finger weighting by means of displacing a position of fingers to be weighted, wherein the improvement comprises: the fingers to be weighted are functionally divided at least once in their longitudinal direction so as to create sub-fingers; the sub-fingers are offset relative to one another in a primary wave propagation direction by a dimension corresponding to a prescribed weighting; and adjacent ends of corresponding sub-fingers being connected to one another.

6. An acoustic wave component which functions with reflected acoustic waves, comprising: a substrate on which the acoustic waves travel; input means and output means for the acoustic waves on the substrate; a reflector structure on the substrate having strip-like fingers whose weighting is determined by displacing a position of the fingers; at least some of the fingers to be weighted being functionally divided at least once in a longitudinal direction so as to create sub-fingers; and the sub-fingers being offset relative to one another in a primary wave propagation direction by a dimension corresponding to a prescribed weighting.

* * * * *